United States Patent
Shiraki et al.

(10) Patent No.: US 6,852,476 B2
(45) Date of Patent: Feb. 8, 2005

(54) RADIATION SENSITIVE RESIN COMPOSITION, RIB, RIB FORMING METHOD AND DISPLAY ELEMENT

(75) Inventors: Shinji Shiraki, Tokyo (JP); Masayoshi Suzuki, Tokyo (JP); Hirofumi Sasaki, Tokyo (JP); Kazuaki Niwa, Tokyo (JP)

(73) Assignee: JSR Corporation, Tokyo (JP)

( * ) Notice: Subject to any disclaimer, the term of this patent is extended or adjusted under 35 U.S.C. 154(b) by 134 days.

(21) Appl. No.: 10/235,718

(22) Filed: Sep. 6, 2002

(65) Prior Publication Data

US 2003/0068574 A1 Apr. 10, 2003

(30) Foreign Application Priority Data

Sep. 7, 2001 (JP) ....................................... 2001-271609

(51) Int. Cl.$^7$ ......................... H01J 1/62; G02F 1/1339
(52) U.S. Cl. ....................... 430/321; 313/504; 349/156
(58) Field of Search .............................. 430/270.1, 319, 430/320, 321; 313/504; 349/122, 156

(56) References Cited

FOREIGN PATENT DOCUMENTS

| EP | 0 493 172 | 7/1992 |
|----|-----------|--------|
| EP | 0 880 075 | 11/1998 |
| EP | 1 046 957 | 10/2000 |
| JP | A-11-281815 | 10/1999 |
| WO | WO 01/63362 | 8/2001 |

OTHER PUBLICATIONS

Applied Physics., vol. 70, No. 1, pp. 70–73, "Organic EL Thin Film Forming Technology". 2001 (with partial English translation).

Monthly Display, No. 9, pp. 15–19, "Full–Color Organic EL Element by an Ink Jet Technique". 2000 (with partial English translation).

T. Shimoda, et al., SID Digest, pp. 376–379, "Multicolor Pixel Patterning of Light–Emitting Polymers by Ink–Jet Printing", 1999.

Patent Abstracts of Japan, JP 11–329724, Nov. 30, 1999.

*Primary Examiner*—John A. McPherson
(74) *Attorney, Agent, or Firm*—Oblon, Spivak, McClelland, Maier & Neustadt, P.C.

(57) ABSTRACT

A radiation sensitive resin composition for forming a rib comprising (A) a copolymer of (a-1) hexafluoropropylene, (a-2) an unsaturated carboxylic acid and/or unsaturated carboxylic anhydride and (a-3) an unsaturated compound other than the components (a-1) and (a-2), (B) an acid generating compound which generates an acid upon exposure to radiation, (C) a crosslinkable compound and (D) a fluorine-containing organic compound other than the component (A). A rib formed from the composition, a rib forming method, and an organic EL display element and liquid crystal display element having the rib.

The rib does not cause a "satellite" phenomenon when an organic EL layer or ITO transparent electrodes are formed by coating, and an organic EL display element and liquid crystal display element having the rib of the present invention are excellent in productivity and reliability.

22 Claims, No Drawings

RADIATION SENSITIVE RESIN COMPOSITION, RIB, RIB FORMING METHOD AND DISPLAY ELEMENT

DETAILED DESCRIPTION OF THE INVENTION

1. Field of the Invention

The present invention relates to a radiation sensitive resin composition, a rib formed from the composition, a rib forming method and a display element having the rib. More specifically, it relates to a negative type radiation sensitive resin composition suitable for the formation of a rib using radiation such as ultraviolet rays, deep ultraviolet rays, X-ray, electron beams, molecular beams, γ-ray, synchrotron radiation or proton beams, a rib for an organic EL display element formed from the above composition, a rib for the ITO electrodes of a liquid crystal display element formed from the above composition, a rib forming method, and an organic EL display element and a liquid crystal display element having the rib.

2. Description of the Prior Art

An organic EL display element has various advantages over a liquid crystal display element, such as no dependence upon view angle as it emits light by itself, excellent impact resistance as it is a solid element, low voltage drivability, low power consumption and high operation stability at a low temperature range. Since the organic EL display element has the above advantages, it is highly expected to be used for mobile applications such as portable terminals and car equipment, and its researches are being made energetically.

The organic EL display element comprising a low-molecular weight emitting materials are generally produced by the following method according to the type of a display element. For a passive organic display element, a transparent electrode (hole injection electrode) pattern made from, for example, tin doped indium oxide (ITO) and a hole transport layer pattern are first formed on a substrate. Then, an insulating film pattern and a cathode rib pattern are formed, followed by the formation of an organic EL layer, an electron transport layer and a cathode. For an active organic EL display element, an ITO pattern and a hole transport layer pattern are formed. After a rib pattern for an organic EL layer is formed, an organic EL layer pattern is formed and then an electron transport layer and a cathode are formed. As the material used in the organic EL layer are known a low-molecular organic EL material and a polymer organic EL material.

In the step of forming an organic EL layer, a deposition method making use of masking and a method of patterning an organic EL material dissolved in a solvent between the pre-formed ribs by a coating technique such as screen printing or ink jet coating are employed. However, to form an organic EL layer from a polymer organic EL material having a long emission life and high emission brightness, the latter method is used because the deposition method cannot be used.

A phenomenon called "satellite" that the applied solution is scattered and adhered to a portion other than predetermined pixel regions may occur. When this happens, an emission area become smaller than the predetermined size and high brightness may not be obtained. As far as this happens, there is limitation to the improvement of patterning accuracy. Therefore, there arises a problem that the patterning accuracy cannot be further improved.

When a rib is formed from a conventionally known material, the satellite phenomenon inevitably occurs at a certain probability and cannot be eliminated by improving the step of applying an organic EL material. Therefore, a rib material which does not cause the satellite phenomenon is strongly desired but yet to be proposed.

Meanwhile, a tin doped indium oxide film (ITO film) is widely used as transparent electrodes for a liquid crystal display element. The ITO electrodes are generally formed by the following method.

An ITO film is first formed on a substrate by deposition or sputtering. After a resist is applied to the film, it is exposed to light through a predetermined pattern mask and developed to form a cured resist only on portions corresponding to a desired electrode pattern of the ITO film. Thereafter, unnecessary portions of the ITO film are removed by wet etching and the resist is removed to obtain transparent electrodes of interest.

Although this method has an advantage that the large screen can be produced at a low cost, it has a large number of steps, limitation to the improvement of productivity and an environmental preservation problem that harmful waste solutions such as a corrosive etching solution and a resist removing solution comprising an organic solvent harmful to living creatures are produced in large quantities.

To improve the above situation, the following method is being studied as means of forming transparent electrodes.

That is, electrically insulating ribs are first formed on a substrate in advance, a solution prepared by dissolving an ITO precursor such as an organic indium compound or organic tin compound in an organic solvent is filled in gaps between the above ribs by a coating technique such as screen printing or ink jet coating, the solvent is removed, and ITO is formed by heating to obtain a desired transparent electrode pattern.

This method has advantages such as a small number of steps and a reduction in the discharge of waste solutions. However, the "satellite" phenomenon that the applied solution is scattered and adhered to a portion other than predetermined areas may occur and cause malfunctioning or a display failure.

Even when ribs used to form ITO electrodes by the latter method are produced from a conventionally known material, the above problem inevitably occurs at a predetermined probability and cannot be solved by improving the process. Therefore, a rib material which is free from the above problem is strongly desired but has not yet been proposed.

SUMMARY OF THE INVENTION

It is an object of the present invention to provide a radiation sensitive resin composition for forming a rib, which is suitable for use as a rib material when an organic EL layer is formed by coating in the production of an organic EL display element or when ITO transparent electrodes are formed in the production of a liquid crystal display element.

It is another object of the present invention to provide a rib formed from the above radiation sensitive resin composition, and an organic EL display element and a liquid crystal display element having the rib.

It is still another object of the present invention to provide a method of forming a rib from the above radiation sensitive resin composition.

Other objects and advantages of the present invention will become apparent from the following description.

According to the present invention, firstly, the above objects and advantages of the present invention are attained by a radiation sensitive resin composition for forming a rib, comprising:

(A) a copolymer (may be referred to as "component (A)" hereinafter) of (a-1) hexafluoropropylene, (a-2) an unsaturated carboxylic acid and/or unsaturated carboxylic anhydride and (a-3) an unsaturated compound other than the above components (a-1) and (a-2), (B) a compound which generates an acid upon exposure to radiation (may be referred to as "component (B)" hereinafter), (C) a crosslinkable compound (may be referred to as "component (C)" hereinafter), and (D) a fluorine-containing organic compound other than the component (A) (may be referred to as "component (D)" hereinafter).

According to the present invention, secondly, the above objects and advantages of the present invention are attained by a rib formed from the above composition of the present invention, for example, a rib for an organic EL display element or liquid crystal display element.

According to the present invention, thirdly, the above objects and advantages of the present invention are attained by an organic EL display element or liquid crystal display element having the above rib of the present invention.

According to the present invention, in the fourth place, the above objects and advantages of the present invention are attained by a method of forming a rib for a display element, comprising the steps of:

applying the above composition of the present invention to a substrate to form a coating film, exposing the coating film to radiation through a rib forming pattern mask, and developing the coating film with an alkaline developer to form a patterned rib.

DETAILED DESCRIPTION OF THE PREFERRED EMBODIMENT

The present invention will be described in detail hereinunder. A description is first given of each component of the radiation sensitive resin composition for forming a rib of the present invention.

Component (A)

The component (A) used in the radiation sensitive resin composition for forming a rib of the present invention is a copolymer of (a-1) hexafluoropropylene (may be referred to as "monomer (a-1)" hereinafter), (a-2) an unsaturated carboxylic acid and/or unsaturated carboxylic anhydride (may be referred to as "monomer (a-2)" hereinafter) and (a-3) an unsaturated compound other than the above components (a-1) and (a-2) (maybe referred to as "monomer (a-3)" hereinafter).

Examples of the unsaturated carboxylic acid and/or unsaturated carboxylic anhydride as the monomer (a-2) constituting the copolymer include unsaturated mono- or di-carboxylic acids such as crotonic acid, maleic acid, 3-butenoic acid, 4-pentenoic acid and itaconic acid; (meth)acrylates of a hydroxy fatty acid such as (meth)acryloyloxyacetic acid, 3-(meth)acryloyloxypropionic acid, 2-(meth)acryloyloxypropionic acid and 4-(meth)acryloyloxybutanoic acid; (meth)acrylates of an aromatic hydroxycarboxylic acid such as 4-(meth)acryloyloxybenzoic acid, 3-(meth)acryloyloxybenzoic acid, 2-(meth)acryloyloxybenzoic acid, 4-(meth)acryloyloxyphthalic acid, 3-(meth)acryloyloxyphthalic acid, 4-(meth)acryloyloxyisophthalic acid, 5-(meth)acryloyloxyisophthalic acid and 2-(meth)acryloyloxyterephthalic acid; mono(meth)acryloyloxyethyl esters of a dicarboxylic acid such as mono(2-(meth)acryloyloxy)ethyl succinate, mono(2-(meth)acryloyloxy) ethyl phthalate, mono(2-(meth)acryloyloxy)ethyl isophthalate, mono(2-(meth)acryloyloxy)ethyl terephthalate, mono(2-(meth)acryloyloxy)ethyl tetrahydrophthalate, mono(2-(meth)acryloyloxy)ethyl tetrahydroisophthalate and mono(2-(meth)acryloyloxy)ethyl tetrahydroterephthalate; monoalkyl esters having a carboxyl group of an unsaturated carboxylic acid such as monomethy, monoethyl, monopropyl, mono-i-propyl, monobutyl, mono-sec-butyl and mono-tert-butyl of itaconic acid; and unsaturated carboxylic anhydrides such as maleic anhydride, itaconic anhydride, citraconic anhydride, muconic anhydride, 3-vinyl phthalic anhydride, 4-vinyl phthalic anhydride, methyl-5-norbornene-2,3-dicarboxylic anhydride, 5-norbornene-2,3-dicarboxylic anhydride, 3,4,5,6-tetrahydrophthalic anhydride, cis-1,2,3,6-tetrahydrophthalic anhydride and dimethyl tetrahydrophthalic anhydride.

Out of these, unsaturated mono- and di-carboxylic acids are preferred, and crotonic acid, maleic acid and itaconic acid are particularly preferred.

The above monomers (a-2) may be used alone or in combination of two or more.

Example of the above monomer (a-3) include hydroxyl group-containing vinyl ethers such as 2-hydroxyethylvinyl ether, 3-hydroxypropylvinyl ether, 2-hydroxypropylvinyl ether, 4-hydroxybutylvinyl ether, 3-hydroxybutylvinyl ether, 5-hydroxypentylvinyl ether and 6-hydroxyhexylvinyl ether; hydroxyl group-containing allyl ethers such as 2-hydroxyethylallyl ether, 4-hydroxybutylallyl ether and glycerol monoallyl ether; allyl alcohols; alkyl vinyl ethers and cycloalkyl vinyl ethers such as methyl vinyl ether, ethyl vinyl ether, n-propyl vinyl ether, isopropyl vinyl ether, n-butyl vinyl ether, isobutyl vinyl ether, tert-butyl vinyl ether, n-pentyl vinyl ether, n-hexyl vinyl ether, n-octyl vinyl ether, n-dodecyl vinyl ether, 2-ethylhexyl vinyl ether and cyclohexyl vinyl ether; perfluoro(alkyl vinyl ethers) and perfluoro(alkoxyalkyl vinyl ethers) such as perfluoro (methyl vinyl ether), perfluoro(ethyl vinyl ether), perfluoro (propyl vinyl ether), perfluoro(butyl vinyl ether), perfluoro (isobutyl vinyl ether) and perfluoro(propoxypropyl vinyl ether); (fluoroalkyl)vinyl ethers and (fluoroalkoxyalkyl) vinyl ethers represented by $CH_2=CH-O-Rf$ (Rf is an alkyl group or alkoxyalkyl group having a fluorine atom); fluoroolefins such as vinylidene fluoride, chlorotrifluoroethylene, 3,3,3-trifluoropropylene and tetrafluoroethylene; carboxylic acid vinyl esters such as vinyl acetate, vinyl propionate, vinyl butyrate, vinyl pivalate, vinyl caproate, vinyl versatate and vinyl stearate; α-olefins such as ethylene, propylene and isobutene; fluorine-containing (meth)acrylic acid esters such as 2,2,2-trifluoroethyl (meth)acrylate, 2,2,3,3,3-pentafluoropropyl (meth)acrylate, 2-(perfluorobutyl)ethyl (meth)acrylate, 2-(perfluorohexyl)ethyl (meth)acrylate, 2-(perfluorooctyl) ethyl (meth)acrylate and 2-(perfluorodecyl)ethyl (meth) acrylate; (meth)acrylic acid esters such as methyl (meth) acrylate, ethyl (meth)acrylate, n-butyl (meth)acrylate, isobutyl (meth)acrylate, 2-methoxyethyl (meth)acrylate, 2-ethoxyethyl (meth)acrylate and 2-(n-propoxy)ethyl (meth) acrylate; epoxy group-containing (meth)acrylates such as glycidyl (meth)acrylate, α-ethylglycidyl (meth)acrylate, α-n-propylglycidyl (meth)acrylate, α-n-butylglycidyl (meth)acrylate, 3,4-epoxybutyl (meth)acrylate, 3,4-epoxyheptyl (meth)acrylate and α-ethyl-6,7-epoxyheptyl (meth)acrylate; epoxy group-containing unsaturated aliphatic compounds such as allyl glycidyl ether, 2-vinylcyclohexene oxide, 3-vinylcyclohexene oxide and 4-vinylcyclohexene oxide; and glycidyl ethers such as vinyl glycidyl ether, 2-vinylbenzyl glycidyl ether, 3-vinylbenzyl glycidyl ether, 4-vinylbenzyl glycidyl ether, α-methyl-2-vinylbenzyl glycidyl ether, α-methyl-3-vinylbenzyl glycidyl ether, α-methyl-4-vinylbenzyl glycidyl ether, 2,3-diglycidyloxymethyl styrene, 2,4-diglycidyloxymethyl styrene, 2,5-diglycidyloxymethyl styrene, 2,6-diglycidyloxymethyl styrene, 2,3,4-triglycidyloxymethyl styrene, 2,3,5-triglycidyloxymethyl styrene, 2,3,6-triglycidyloxymethyl styrene, 3,4,5-triglycidyloxymethyl styrene and 2,4,6-triglycidyloxymethyl styrene.

Out of these monomers (a-3), alkyl vinyl ethers, cycloalkyl vinyl ethers, carboxylic acid vinyl esters, (fluoroalkyl)vinyl ethers and (fluoroalkoxyalkyl)vinyl ethers are preferred, and methyl vinyl ether, ethyl vinyl ether, n-propyl vinyl ether, isopropyl vinyl ether, tert-butyl vinyl ether, vinyl acetate, vinyl propionate, vinyl butyrate, vinyl pivalate, perfluoroalkyl perfluorovinyl ethers and perfluoroalkoxyalkyl perfluorovinyl ethers are particularly preferred.

These monomers may be used alone or in combination of two or more.

As for the amount of each monomer constituting the fluorine-containing copolymer in the present invention, the amount of the monomer (a-1) is preferably 20 to 70 wt %, more preferably 25 to 55 wt %, the amount of the monomer (a-2) is preferably 1 to 40 wt %, more preferably 10 to 30 wt %, and the amount of the monomer (a-3) is preferably 10 to 70 wt %.

When the amount of the monomer (a-1) is smaller than 53 wt %, a fluorine-containing monomer such as perfluoro (alkyl vinyl ether) or perfluoro(alkoxyalkyl vinyl ether) is desirably used as the monomer (a-3) in order to increase content of fluorine.

The total content of fluorine in the component (A) is preferably 40 wt % or more, more preferably 45 wt % or more. When a cured product obtained by containing the above amount of the component (a-1) and the above total amount of fluorine is used as a rib, the satellite phenomenon hardly occurs in the step of applying an organic EL material or ITO precursor.

When the amount of the monomer (a-2) is smaller than 1 wt %, the alkali solubility of the polymer lowers, sufficient crosslinking density is hardly obtained, and sensitivity to radiation and the film retention may deteriorate. When the amount is larger than 40 wt %, pattern formation may become difficult.

The composition obtained by copolymerizing the monomer (a-3) in the above range is excellent in developability and pattern forming properties.

The copolymer as the component (A) is produced by radically polymerizing the above monomer (a-1), monomer (a-2) and monomer (a-3) in a polymerization solvent. They may be polymerized while the functional groups of the monomers are protected and then the functional groups may be deblocked as required.

Examples of the polymerization solvent used to produce the component (A) include alcohols such as methyl alcohol, ethyl alcohol, propyl alcohol and butyl alcohol; cyclic ethers such as tetrahydrofuran and dioxane; aromatic hydrocarbons such as benzene, toluene and xylene; amide-based aprotic polar solvents such as N,N-dimethylformamide and N-methyl-2-pyrrolidone; esters such as ethyl acetate, butyl acetate, isoamyl acetate and ethyl lactate; alkoxy esters such as methyl 3-methoxypropionate, methyl 2-methoxypropionate, ethyl 3-methoxypropionate, ethyl 2-methoxypropionate, ethyl 3-ethoxypropionate and ethyl 2-ethoxypropionate; (di)glycol dialkyl esters such as ethylene glycol dimethyl ether, diethylene glycol dimethyl ether, diethylene glycol diethyl ether, diethylene glycol methyl ethyl ether, propylene glycol dimethyl ether and dipropylene glycol dimethyl ether; (di)glycol monoalkyl ethers such as ethylene glycol monomethyl ether, ethylene glycol monoethyl ether, diethylene glycol monomethyl ether, diethylene glycol monoethyl ether, propylene glycol monomethyl ether, propylene glycol monoethyl ether, dipropylene glycol monomethyl ether and dipropylene glycol monoethyl ether; glycol monoalkyl ether esters such as propylene glycol monomethyl ether acetate, carbitol acetate and ethyl cellosolve acetate; and ketones such as cyclohexanone, methyl ethyl ketone, methyl isobutyl ketone and 2-heptanone. These polymerization solvents may be used alone or in combination of two or more.

The ratio of the polymerization solvent to the reaction raw materials is not particularly limited. However, the polymerization solvent is used in an amount of 20 to 1,000 parts by weight based on 100 parts by weight of the total of the monomer (a-1), monomer (a-2) and monomer (a-3).

The polymerization initiator for radical polymerization is, for example, an azo compound such as 2,2'-azobisisobutyronitrile, 2,2'-azobis-(2,4-dimethylvaleronitrile) or 2,2'-azobis(4-methoxy-2,4-dimethylvaleronitrile), an organic peroxide such as benzoyl peroxide, lauroyl peroxide, tert-butyl peroxypivalate or 1,1-bis (tert-butylperoxy)cyclohexane, or hydrogen peroxide. When a peroxide is used as a polymerization initiator, a redox polymerization initiator prepared by combining the peroxide with a reducing agent may be used.

The component (A) has a number average molecular weight in terms of polystyrene of preferably 1,000 to 100,000, more preferably 1,000 to 50,000. When a fluorine-containing copolymer having a number average molecular weight in terms of polystyrene of less than 1,000 is used, the obtained pattern may have a bad shape, the film retention of the pattern may lower, or the heat resistance of the pattern may deteriorate. When the component (A) having a number average molecular weight in terms of polystyrene of more than 100,000 is used, the radiation sensitive resin composition may have poor coatability and low developability and the obtained pattern may have a bad shape.

Component (B)

The acid generating compound which generates an acid upon exposure to radiation as the component (B) is, for example, a trichloromethyl-s-triazine, diaryl iodonium salt or triarylsulfonium salt.

Examples of the above trichloromethyl-s-triazine include 2,4,6-tris(trichloromethyl)-s-triazine, 2-phenyl-4,6-bis (trichloromethyl)-s-triazine, 2-(4-chlorophenyl)-4,6-bis (trichloromethyl)-s-triazine, 2-(3-chlorophenyl)-4,6-bis (trichloromethyl)-s-triazine, 2-(2-chlorophenyl)-4,6-bis (trichloromethyl)-s-triazine, 2-(4-methoxyphenyl)-4,6-bis (trichloromethyl)-s-triazine, 2-(3-methoxyphenyl)-4,6-bis (trichloromethyl)-s-triazine, 2-(2-methoxyphenyl)-4,6-bis (trichloromethyl)-s-triazine, 2-(4-methylthiophenyl)-4,6-bis (trichloromethyl)-s-triazine, 2-(3-methylthiophenyl)-4,6-bis (trichloromethyl)-s-triazine, 2-(2-methylthiophenyl)-4,6-bis (trichloromethyl)-s-triazine, 2-(4-methoxynaphthyl)-4,6-bis (trichloromethyl)-s-triazine, 2-(3-methoxynaphthyl)-4,6-bis (trichloromethyl)-s-triazine, 2-(2-methoxynaphthyl)-4,6-bis (trichloromethyl)-s-triazine, 2-(4-methoxy-β-styryl)-4,6-bis (trichloromethyl)-s-triazine, 2-(3-methoxy-β-styryl)-4,6-bis (trichloromethyl)-s-triazine, 2-(2-methoxy-β-styryl)-4,6-bis (trichloromethyl)-s-triazine, 2-(3,4,5-trimethoxy-β-styryl)-4,6-bis(trichloromethyl)-s-triazine, 2-(4-methylthio-β-styryl)-4,6-bis(trichloromethyl)-s-triazine, 2-(3-methylthio-β-styryl)-4,6-bis(trichloromethyl)-s-triazine, 2-(2-methylthio-β-styryl)-4,6-bis(trichloromethyl)-s-triazine, 2-piperonyl-4,6-bis(trichloromethyl)-s-triazine, 2-[2-(furan-2-yl)ethenyl]-4,6-bis(trichloromethyl)-s-triazine, 2-[2-(5-methylfuran-2-yl)ethenyl]-4,6-bis (trichloromethyl)-s-triazine and 2-[2-(4-diethylamino-2-methylphenyl)ethenyl]-4,6-bis (trichloromethyl)-s-triazine.

Examples of the above diaryl iodonium salt include diphenyliodonium tetrafluoroborate, diphenyliodonium hexafluorophosphonate, diphenyliodonium hexafluoroarsenate, diphenyliodonium trifluoromethane sulfonate, diphenyliodonium trifluoroacetate, diphenyliodonium-p-toluene sulfonate, 4-methoxyphenyliodonium tetrafluoroborate, 4-methoxyphenylphenyliodonium hexafluorophosphonate, 4-methoxyphenylphenyliodonium hexafluoroarsenate, 4-methoxyphenylphenyliodonium trifluoromethane sulfonate, 4-methoxyphenylphenyliodonium trifluoroacetate, 4-methoxyphenylphenyliodonium-p-toluene sulfonate, bis(4-tert-butylphenyl)iodonium tetrafluoroborate, bis(4-tert-butylphenyl)iodonium hexafluoroarsenate, bis(4-tert-butylphenyl)iodonium trifluoromethane sulfonate, bis(4-tert-butylphenyl)iodonium trifluoroacetate and bis(4-tert-butylphenyl)iodonium-p-toluene sulfonate.

Examples of the above triaryl sulfonium salt include triphenylsulfonium tetrafluoroborate, triphenylsulfonium hexafluorophosphonate, triphenylsulfonium hexafluoroarsenate, triphenylsulfonium trifluoromethane sulfonate, triphenylsulfonium trifluoroacetate, triphenylsulfonium-p-toluene sulfonate, 4-methoxyphenyldiphenylsulfonium tetrafluoroborate, 4-methoxyphenyldiphenylsulfonium hexafluorophosphonate, 4-methoxyphenyldiphenylsulfonium hexafluoroarsenate, 4-methoxyphenyldiphenylsulfonium trifluoromethane sulfonate, 4-methoxyphenyldiphenylsulfonium trifluoroacetate, 4-methoxyphenyldiphenylsulfonium-p-toluene sulfonate, 4-phenylthiophenyldiphenyl tetrafluoroborate, 4-phenylthiophenyldiphenyl hexafluorophosphonate, 4-phenylthiophenyldiphenyl hexafluoroarsenate, 4-phenylthiophenyldiphenyl trifluoromethane sulfonate, 4-phenylthiophenyldiphenyl trifluoroacetate and 4-phenylthiophenyldiphenyl-p-toluene sulfonate.

Out of these compounds, 2-(3-chlorophenyl)-4,6-bis (trichloromethyl)-s-triazine, 2-(4-methoxyphenyl)-4,6-bis (trichloromethyl)-s-triazine, 2-(4-methylthiophenyl)-4,6-bis (trichloromethyl)-s-triazine, 2-(4-methoxy-β-styryl)-4,6-bis (trichloromethyl)-s-triazine, 2-piperonyl-4,6-bis (trichloromethyl)-s-triazine, 2-[2-(furan-2-yl)ethenyl]-4,6-bis(trichloromethyl)-s-triazine, 2-[2-(5-methylfuran-2-yl) ethenyl]4,6-bis (trichloromethyl)-s-triazine, 2-[2-(4-diethylamino-2-methylphenyl)ethenyl]-4,6-bis (trichloromethyl)-s-triazine and 2-(4-methoxynaphthyl)-4, 6-bis(trichloromethyl)-s-triazine are preferred as trichloromethyl-s-triazines; diphenyliodonium trifluoroacetate, diphenyliodonium trifluoromethane sulfonate, 4-methoxyphenylphenyliodonium trifluoromethane sulfonate and 4-methoxyphenylphenyliodonium trifluoroacetate are preferred as diaryliodonium salts; and triphenylsulfonium trifluoromethane sulfonate, triphenylsulfonium trifluoroacetate, 4-methoxyphenyldiphenylsulfonium trifluoromethane sulfonate, 4-methoxyphenyldiphenylsulfonium trifluoroacetate, 4-phenylthiophenyldiphenyl trifluoromethane sulfonate and 4-phenylthiophenyldiphenyl trifluoroacetate are preferred as triarylsulfonium salts.

The amount of the component (B) is preferably 0.001 to 30 parts by weight, particularly preferably 0.01 to 10 parts by weight based on 100 parts by weight of the component (A).

Since the amount of an acid generated upon exposure to radiation is small when the amount of the component (B) is smaller than 0.001 part by weight based on 100 parts by weight of the component (A), the crosslinking of the molecules of the component (A) does not proceed completely, and the film retention after development and the heat resistance, chemical resistance and adhesion to a substrate of the obtained pattern may deteriorate. When the amount of the component (B) is larger than 30 parts by weight based on 100 parts by weight of the component (A), there may arise a problem in the formation of a pattern.

Component (C)

The crosslinkable compound as the component (C) has at least one group (to be referred to as "crosslinkable group" hereinafter) which can be crosslinked by the function of an acid generated from the component (B).

The crosslinkable group is, for example, an amino group, alkoxyalkyl group or epoxy group. Examples of the alkoxymethyl group include methoxymethyl group, ethoxybutyl group, propoxybutyl group, butoxymethyl group and t-butoxymethyl group.

Examples of the compound having at least one amino group and/or alkoxyalkyl group include melamine resin, benzoguanamine resin, glycoluril resin, urea resin, alkoxymethyl melamine resin, alkoxymethyl benzoguanamine resin, alkoxymethyl glycoluril resin and alkoxymethyl urea resin.

The above alkoxymethyl melamine resin, alkoxymethyl benzoguanamine resin, alkoxymethyl glycoluril resin and alkoxymethyl urea resin are obtained by substituting the methylol groups of a methylol melamine resin, methylol benzoguanamine resin, methylol glycoluril resin and methylol urea resin with an alkoxymethyl group, respectively. The type of the alkoxymethyl group is not particularly limited, as exemplified by methoxymethyl group, ethoxymethyl group, propoxymethyl group, butoxymethyl group and t-butoxymethyl group.

Commercially available products of the above compound include Cymel 300, 301, 303, 370, 325, 327, 701, 266, 267, 238, 1141, 272, 202, 1156, 1158, 1123, 1170 and 1174, and UFR65 and 300 (of Mitsui Cyanamid Co., Ltd.), and Nikalac Mx-750, Mx-032, Mx-706, Mx-708, Mx-40, Mx-31, Ms-11 and Mw-30 (of Sanwa Chemical Co., Ltd.).

The compound having at least one epoxy group is preferably a compound having at least two epoxy groups in the molecule. Examples of the compound include bisphenol A epoxy resin, bisphenol F epoxy resin, phenol novolak epoxy resin, cresol novolak epoxy resin, cyclic aliphatic epoxy resin, and aliphatic polyglycidyl ether.

Commercially available products of the above compound are given below. Commercially available products of the bisphenol A epoxy resin include Epicoat 1001, 1002, 1003, 1004, 1007, 1009, 1010 and 828 (of Yuka Shell Epoxy Co., Ltd.), those of the bisphenol F epoxy resin include Epicoat 807 (of Yuka Shell Co., Ltd.), those of the phenol novolak epoxy resin include Epicoat 152 and 154 (of Yuka Shell Epoxy Co., Ltd.) and EPPN201 and 202 (of Nippon Kayaku Co., Ltd.), those of the cresol novolak epoxy resin include EOCN-102, EOCN-103S, EOCN-104S, EOCN-1020, EOCN-1025 and EOCN-1027 (of Nippon Kayaku Co., Ltd.) and Epicoat 180S75 (of Yuka Shell Epoxy Co., Ltd.), those of the cyclic aliphatic epoxy resin include CY175, CY177 and CY179 (of CIBA-GEIGY A.G.), ERL-4234, ERL-4299, ERL-4221 and ERL-4206 (of U.C.C. Co., Ltd.), Showdyne 509 (of Showa Denko K.K.), Araldyte CY-182, CY-192 and CY-184 (of CIBA-GEIGY A.G.), Epichlon 200 and 400 (of Dainippon Ink and Chemicals, Inc.), Epicoat 871 and 872 (of Yuka Shell Epoxy Co., Ltd.) and ED-5661 and ED-5662 (of Ceranees Coating Co., Ltd.), and those of the aliphatic polyglycidyl ether include Epolite 100MF (of Kyoeisha Chemical Co., Ltd.) and Epiol TMP (of NOF Corporation).

Besides the above compounds, glycidyl ethers of bisphenol A or bisphenol F may also be advantageously used.

Out of the above compounds, alkoxymethyl melamine resin, alkoxymethyl benzoguanamine resin, bisphenol A epoxy resin, phenol novolak epoxy resin and cresol novolak epoxy resin are preferred.

These crosslinkable compounds may be used alone or in combination of two or more.

When an epoxy group-containing unsaturated monomer is used as the monomer (a-3) out of the monomers constituting the copolymer of the component (A), it can be said that the component (A) is also a "crosslinkable compound" but differs from the component (C) in that it contains a large amount of fluorine and has alkali solubility.

The amount of the component (C) is preferably 1 to 100 parts by weight, more preferably 5 to 50 parts by weight based on 100 parts by weight of the component (A).

When the amount of the component (C) is smaller than 1 part by weight based on 100 parts by weight of the component (A), the crosslinking of the system becomes incomplete, thereby making it difficult to form a pattern. When the amount of the component (C) is larger than 100 parts by weight based on 100 parts by weight of the component (A), the film retention after development may lower.

Component (D)

Preferred examples of the fluorine-containing organic compound other than the component (A) which is the component (D) include perfluoroalkylsulfonic acids, perfluoroalkylcarboxylic acids, perfluoroalkylalkylene oxide adducts, perfluoroalkyltrialkyl ammonium salts, oligomers having a perfluoroalkyl group and hydrophilic group, oligomers having a perfluoroalkyl group and lipophilic group, oligomers having a perfluoroalkyl group, hydrophilic group and lipophilic group, urethanes having a perfluoroalkyl group and hydrophilic group, perfluoroalkyl esters, perfluoroalkylphosphoric acid esters, methyltrifluorosilane, trimethylfluorosilane, trifluoromethyltrimethylsilane, (3,3,3-trifluoropropyl)dimethylchlorosilane, 3-(heptafluoroisopropoxy)-propyltrichlorosilane, 3-(3,3,3-trifluoropropyl)heptamethyltrisilane and (3,3,3-trifluoropropyl)trimethoxysilane.

Out of these, perfluoroalkylcarboxylic acids and (3,3,3-trifluoropropyl)trimethoxysilane are particularly preferred.

Commercially available products of the above compound include Megafac F116, F120, F142D, F144D, F150, F160, F171, F172, F173, F177, F178A, F178RM, F178K, F179, F183, F184, F191, F812, F815, F824, F833, DEFENSA MCF300, MCF310, MCF312 and MCF323 (of Dainippon Ink and Chemicals, Inc.), Florade FC430 and FC431 (of Sumitomo 3M Limited), and Asahi Guard AG710, Surflon S-382, SC-101, SC-102, SC-103, SC-104, SC-105 and SC-106 (of Asahi Glass Co., Ltd.), and FS1265 and AY43-158E (of Toray Dow Corning Silicone Co., Ltd.).

These fluorine-containing organic compounds may be used alone or in combination of two or more.

The amount of the component (D) in the present invention is preferably 0.001 to 15 parts by weight, more preferably 0.01 to 10 parts by weight based on 100 parts by weight of the component (A). When the amount of the component (D) is smaller than 0.001 part by weight based on 100 parts by weight of the component (A), the contact angle between a polymer organic EL material and the composition of the present invention becomes small, whereby the composition is apt to spread to the outside of the polymer organic EL material region. When the amount of the component (D) is larger than 15 parts by weight based on 100 parts by weight of the component (A), the residual film may become lower after development. Also, coatability may be deteriorated by the influence of formed bubbles.

When a bisphenol F type epoxy resin or glycidyl ether of bisphenol F is used as the component (C), it can be said that they are also a "fluorine-containing organic compound other than the component (A)" but differ from the component (D) having no crosslinkable group in that they have a crosslinkable group.

Other Components

The radiation sensitive resin composition of the present invention may contain a sensitizer. The sensitizer is, for example, a flavone, dibenzalacetone, dibenzalcyclohexane, chalcone, xanthene, thioxanthene, porphyrin, phthalocyanine, acridine, anthracene, benzophenone, acetophenone or coumarin having a substituent at the 3-position and/or 7-position.

The amount of the sensitizer is preferably 30 parts or less by weight, more preferably 0.1 to 20 parts by weight based on 100 parts by weight of the component (A).

The radiation sensitive resin composition of the present invention may contain a surfactant other than a fluorine-based surfactant to improve coatability (for example, prevention of striation) and developability.

Examples of the surfactant other than a fluorine-based surfactant include nonionic surfactants such as polyoxyethylene alkyl ethers including polyoxyethylene lauryl ether, polyoxyethylene stearyl ether and polyoxyethylene oleyl ether; polyoxyethylene aryl ethers including polyoxyethylene octylphenyl ether and polyoxyethylene nonylphenyl ether; and polyethylene glycol dialkyl esters including polyethylene glycol dilaurate and polyethylene glycol distearate; and other surfactants which are commercially available under the trade names of organosiloxane polymer KP341 (of Shin-Etsu Chemical Co., Ltd.) and acrylic or methacrylic acid-based (co)polymer Polyflow No. 57 and No. 95 (of Kyoeisha Chemical Co., Ltd.).

The amount of the surfactant other than a fluorine-based surfactant is preferably 2 parts or less by weight, more preferably 1 part or less by weight based on 100 parts by weight of the solids content of the composition.

The radiation sensitive resin composition of the present invention may contain an adhesive aid such as a silane coupling agent to improve adhesion to a substrate. It may also contain an unsaturated compound such as a polyacrylate to improve heat resistance.

The radiation sensitive resin composition of the present invention may further contain an antistatic agent, keeping stabilizer, halation inhibitor, anti-foaming agent, pigment and thermal acid generating agent as required.

Preparation of Radiation Sensitive Resin Composition

The radiation sensitive resin composition of the present invention is prepared by uniformly mixing together (A) the above copolymer, (B) acid generating compound which generates an acid upon exposure to radiation, (C) crosslinkable compound, (D) fluorine-containing organic compound other than the component (A), and optionally other components to be added. Preferably, the radiation sensitive resin composition of the present invention is dissolved in a suitable solvent to be used as a solution. For example, the copolymer components (A) to (D) and optionally other components to be added are added to a suitable solvent in a predetermined ratio and mixed together to prepare a radiation sensitive resin composition in a solution state.

Preferably, the solvent used to prepare the radiation sensitive resin composition of the present invention uniformly dissolves the components (A) to (D) and optionally other components to be added and does not react with these components.

Examples of the solvent used to prepare the above composition solution are identical to those listed as the polymerization solvent used to produce the above fluorine-containing copolymer.

Further, a high-boiling solvent such as benzyl ethyl ether, dihexyl ether, diethylene glycol monomethyl ether, diethylene glycol monoethyl ether, diethylene glycol monobutyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate or carbitol acetate may be added as required.

The amount of the solvent used in the present invention is not particularly limited and may be suitably changed according to the type of a substrate to be used or targeted film thickness. The total amount of the components (A) to (D) and optionally other components to be added in the composition solution is generally 5 to 60 parts by weight, preferably 10 to 50 parts by weight, more preferably 20 to 40 parts by weight.

The composition solution prepared as described above may be filtered with a filter having an opening size of 0.2 to 10 µm before use.

Formation of Rib

A description is subsequently given of the method of forming a rib of the present invention from the radiation sensitive resin composition of the present invention.

The radiation sensitive resin composition of the present invention is applied to the surface of a substrate and, for example, prebaked to remove the solvent so as to form a coating film.

The above substrate is made from, for example, glass, silicon, polycarbonate, polyester, aromatic polyamide, polyamide imide, polyimide or the like. When the composition of the present invention is used to form a rib for an organic EL display element, a substrate having an ITO film on the surface may be used as the substrate.

The above radiation sensitive resin composition may be applied to the surface of the substrate by suitable means known per se, such as spray coating, roll coating or rotational coating.

The above prebaking conditions which differ according to the type and amount of each component are preferably a temperature of 50 to 150° C. and a time of 0.5 to 10 minutes.

The thickness of the coating film after prebaking may be a suitable value according to the purpose of the formed rib. It is, for example, 0.3 to 15 µm, preferably 0.5 to 10 µm, more preferably 0.7 to 6 µm.

Thereafter, the coating film is exposed to radiation such as visible rays, ultraviolet rays, deep ultraviolet rays, electron beams or X-ray through a rib forming pattern mask. The used radiation preferably has a wavelength of 190 to 450 nm, particularly preferably 365 nm (ultraviolet range).

The amount of exposure at this point is preferably 1 to 10,000 J/m$^2$, more preferably 100 to 5,000 J/m$^2$, particularly preferably 100 to 3,000 J/m$^2$.

Then, post-exposure baking (PEB) may be carried out as required. PEB may be carried out at preferably 70 to 160° C., more preferably 80 to 140° C., particularly preferably 90 to 110° C. for preferably 0.5 to 30 minutes, more preferably 1 to 10 minutes, particularly preferably 1 to 5 minutes.

The exposed film is then developed with a developer to remove unnecessary portions in order to form a predetermined pattern. The development is puddle development, dipping development or shower development, and the development time is, for example, 10 to 300 seconds.

The above developer is an alkali aqueous solution such as an aqueous solution of an inorganic alkali such as sodium hydroxide, potassium hydroxide, sodium carbonate, sodium silicate, sodium metasilicate or ammonia; primary amine such as ethylamine or n-propylamine; secondary amine such as diethylamine or di-n-propylamine; tertiary amine such as trimethylamine, methyldiethylamine, dimethylethylamine or triethylamine; tertiary amine such as dimethylethanolamine, methyldiethanolamine or triethanolamine; cyclic tertiary amine such as pyrrole, piperidine, N-methylpiperidine, N-methylpyrrolidine, 1,8-diazabicyclo[5.4.0]-7-undecene or 1,5-diazabicyclo[4.3.0]-5-nonene; aromatic tertiary amine such as pyridine, collidine, lutidine or quinoline; or quaternary ammonium salt such as tetramethylammonium hydroxide or tetraethylammonium hydroxide. An aqueous solution prepared by adding a suitable amount of a water-soluble organic solvent such as methanol or ethanol and/or a surfactant to the above alkali aqueous solution may also be used as the developer.

After development, the coating film is preferably washed in running water for 30 to 90 seconds and dried with compressed air or compressed nitrogen.

Thereafter, post-baking may be carried out as required. The post-baking may be carried out by using heating means such as a hot plate or oven at a predetermined temperature, for example, 150 to 250° C., for a predetermined time, for example, 5 to 30 minutes on a hot plate or 30 to 90 minutes in an oven.

The rib formed as described above has a large contact angle with an organic EL material or an ITO precursor solution This contact angle differs according to the types and concentrations of the used organic EL material, ITO precursor and solvent. The contact angle can be evaluated based on contact angles with three compounds—water, methylene iodide and n-hexadecane.

The rib of the present invention can have a water contact angle of 80° or more, preferably 90° or more, particularly preferably 100° or more. It can have a methylene iodide contact angle of 50° or more, preferably 60° or more, particularly preferably 70° or more. Further, it can have an n-hexadecane contact angle of 20° or more, preferably 30° or more, particularly preferably 40° or more.

The contact angle can be measured with a commercially available goniometer or the like.

The rib of the present invention has a small fall angle on an organic EL material and an ITO precursor solution. That is, when the rib material of the present invention is inclined after the organic EL material or ITO precursor solution is dropped on the rib material of the present invention in a horizontal state, the angle at which the drop begins to move (fall angle) is small. This fall angle differs according to the used solution but can be evaluated based on the fall angles of water and toluene. The rib of the present invention can have a water fall angle of 70° or less, specifically 65° or less. Further, it can have a toluene fall angle of 20° or less, specifically 10° or less.

Since the rib of the present invention has the above characteristic properties, it is advantageous in the efficient production of a highly reliable organic EL display element or liquid crystal display element without causing the satellite phenomenon in the step of applying an organic EL material or ITO precursor solution.

EXAMPLES

The following examples are provided for the purpose of further illustrating the present invention but are in no way to be taken as limiting.

The number average molecular weight in terms of polystyrene of a polymer was measured with the SYSTEM-21 GPC chromatograph of Showa Denko K.K. in tetrahydrofuran (THF) as a carrier solvent at 40° C. and a flow rate of 1 ml/min. Synthesis Examples of fluorine-containing copolymers Synthesis Example 1

After the inside of a 0.5-liter stainless steel autoclave equipped with an electromagnetic stirrer was fully substituted with nitrogen gas, 270 g of ethyl acetate, 22.5 g of ethyl vinyl ether (EVE), 40.3 g of crotonic acid (CA) and 5.4 g of lauroyl peroxide were fed to the autoclave and cooled to −50° C. in a dry ice-methanol bath, and oxygen in the system was removed with nitrogen gas again. Thereafter, 117 g of hexafluoropropylene (HFP) was fed to the autoclave and the temperature began to be raised. The pressure when the inside temperature of the autoclave reached 70° C. was 8.3 kgf/cm$^2$. A reaction was then continued at 70° C. for 12 hours under agitation and when the pressure dropped to 7 kgf/cm$^2$, the autoclave was cooled with water to stop the reaction. When the temperature reached room temperature, unreacted monomers were discharged and the autoclave was opened to obtain a polymer solution having a solid content of 16.8 wt %. The obtained polymer solution was injected into water to precipitate a polymer, and the polymer was purified by re-precipitation with n-hexane and vacuum dried at 50° C. to obtain 80 g of a fluorine-containing copolymer (to be referred to as "resin (1)" hereinafter).

When the number average molecular weight in terms of polystyrene of the obtained resin (1) was measured, it was 2,800.

Synthesis Example 2

After the inside of a 0.5-liter stainless steel autoclave equipped with an electromagnetic stirrer was fully substituted with nitrogen gas, 270 g of diethylene glycol ethyl methyl ether (EDM), 10.7 g of ethyl vinyl ether (EVE), 47.4 g of crotonic acid (CA), 42.63 g of vinyl heptadecafluorononanoate and 5.4 g of lauroyl peroxide were fed to the autoclave and cooled to −50° C. in a dry ice-methanol bath, and oxygen in the system was removed with nitrogen gas again. Thereafter, 118 g of hexafluoropropylene (HFP) was fed to the autoclave and the temperature began to be raised. The pressure when the inside temperature of the autoclave reached 70° C. was 8.5 kgf/cm$^2$. A reaction was then continued at 70° C. for 12 hours under agitation and when the pressure dropped to 8.1 kgf/cm$^2$, the autoclave was cooled with water to stop the reaction. When the temperature reached room temperature, unreacted monomers were discharged and the autoclave was opened to obtain a polymer solution having a solid content of 16.0 wt %. The obtained polymer solution was injected into water to precipitate a polymer, and the polymer was purified by re-precipitation with n-hexane and vacuum dried at 50° C. to obtain 80 g of a fluorine-containing copolymer (to be referred to as "resin (2)" hereinafter).

When the number average molecular weight in terms of polystyrene of the obtained resin (2) was measured, it was 1,800.

Synthesis Example 3

After the inside of a 0.5-liter stainless steel autoclave equipped with an electromagnetic stirrer was fully substituted with nitrogen gas, 270 g of ethyl acetate, 16.3 g of ethyl vinyl ether (EVE), 40.3 g of crotonic acid (CA), 19.7 g of heptafluorobutyl vinyl ether and 5.4 g of lauroyl peroxide were fed to the autoclave and cooled to −50° C. in a dry ice-methanol bath, and oxygen in the system was removed with nitrogen gas again. Thereafter, 117 g of hexafluoropropylene (HFP) was fed to the autoclave and the temperature began to be raised. The pressure when the inside temperature of the autoclave reached 70° C. was 8.2 kgf/cm$^2$. A reaction was then continued at 70° C. for 12 hours under agitation and when the pressure dropped to 7.5 kgf/cm$^2$, the autoclave was cooled with water to stop the reaction. When the temperature reached room temperature, unreacted monomers were discharged and the autoclave was opened to obtain a polymer solution having a solid content of 16.0 wt %. The obtained polymer solution was injected into water to precipitate a polymer, and the polymer was purified by re-precipitation with n-hexane and vacuum dried at 50° C. to obtain 80 g of a fluorine-containing copolymer (to be referred to as "resin (3)" hereinafter).

When the number average molecular weight in terms of polystyrene of the obtained resin (3) was measured, it was 1,900.

Synthesis Example 4

After the inside of a 0.5-liter stainless steel autoclave equipped with an electromagnetic stirrer was fully substituted with nitrogen gas, 270 g of ethyl acetate, 17.0 g of ethyl vinyl ether (EVE), 47.4 g of crotonic acid (CA) and 5.4 g of lauroyl peroxide were fed to the autoclave and cooled to −50° C. in a dry ice-methanol bath, and oxygen in the system was removed with nitrogen gas again. Thereafter, 118 g of hexafluoropropylene (HFP) was fed to the autoclave and the temperature began to be raised. The pressure when the inside temperature of the autoclave reached 70° C. was 8.5 kgf/cm$^2$. A reaction was then continued at 70° C. for 12 hours under agitation and when the pressure dropped to 8.0 kgf/cm$^2$, the autoclave was cooled with water to stop the reaction. When the temperature reached room temperature, unreacted monomers were discharged and the autoclave was opened to obtain a polymer solution having a solid content of 16.2 wt %. The obtained polymer solution was injected into water to precipitate a polymer, and the polymer was purified by re-precipitation with n-hexane and vacuum dried at 50° C. to obtain 80 g of a fluorine-containing copolymer (to be referred to as "resin (4)" hereinafter).

When the number average molecular weight in terms of polystyrene of the obtained resin (4) was measured, it was 2,000.

Synthesis Example 5

After the inside of a 0.5-liter stainless steel autoclave equipped with an electromagnetic stirrer was fully substituted with nitrogen gas, 270 g of ethyl acetate, 34.2 g of ethyl vinyl ether (EVE), 27.2 g of crotonic acid (CA) and 5.4 g of lauroyl peroxide were fed to the autoclave and cooled to −50° C. in a dry ice-methanol bath, and oxygen in the system was removed with nitrogen gas again. Thereafter, 119 g of hexafluoropropylene (HFP) was fed to the autoclave and the temperature began to be raised. The pressure when the inside temperature of the autoclave reached 70° C. was 7.6 kgf/cm$^2$. A reaction was then continued at 70° C. for 12 hours under agitation and when the pressure dropped to 6.3 kgf/cm$^2$, the autoclave was cooled with water to stop the reaction. When the temperature reached room temperature, unreacted monomers were discharged and the autoclave was opened to obtain a polymer solution having a solid content of 19.6 wt %. The obtained polymer solution was injected into water to precipitate a polymer, and the polymer was purified by re-precipitation with n-hexane and vacuum dried at 50° C. to obtain 80 g of a fluorine-containing copolymer (to be referred to as "resin (5)" hereinafter).

When the number average molecular weight in terms of polystyrene of the obtained resin (5) was measured, it was 8,400.

Example 1

100 parts by weight of the resin (3) as the component (A), 5 parts by weight of 2-piperonyl-bis-4,6-(trichloromethyl)-s-triazine as the component (B), 20 parts by weight of Cymel 300 which is a hexamethoxymethylol melamine resin as the component (C) and 1 part by weight of Megafac F178RM (of Dainippon Ink and Chemicals, Inc.; an oligomer having a perfluoroalkyl group and a lipophilic group) as the component (D) were dissolved in diethylene glycol ethyl methyl ether to ensure that the total amount of the component (A) to (D) should be 40 wt %. The resulting solution was filtered with a membrane filter having an opening size of 0.2 μm to prepare the radiation sensitive resin composition of the present invention as a solution.

Evaluation of Radiation Sensitivity

The above prepared composition solution was applied to a glass substrate by a spinner and prebaked on a hot plate at 110° C. for 2 minutes to form a 3.0 μm-thick coating film.

The obtained coating film was exposed to ultraviolet radiation at the optimum focusing depth with the NSR1505i6A reduction projection stepper (of Nikon Corporation, NA=0.45, λ=365 nm) through a mask having a 5.0 μm×5.0 μm dot pattern. The coating film on the glass substrate was divided into sections which differed in the amount of exposure by changing the exposure time. Thereafter, the coating film was PEB'ed on a hot plate at 110° C. for 2 minutes, developed with a 0.5 wt % aqueous solution of tetramethylammonium hydroxide at 25° C. for 1 minute, washed in water and dried to form a dot pattern.

The minimum amount of exposure required for the resolution of the 5.0 μm×5.0 μm pattern is shown in Table 1. When this value is smaller than 300 J/m$^2$, radiation sensitivity is excellent, when the value is 300 J/m$^2$ or more and less than 500 J/m$^2$, radiation sensitivity is satisfactory and when the value is 500 J/m$^2$ or more, radiation sensitivity is unsatisfactory.

Formation of Substrate (1) for Evaluation

The composition solution was applied to a glass substrate by a spinner and prebaked on a hot plate at 110° C. for 2 minutes to form a 3.0 μm-thick coating film.

The obtained coating film was exposed to ultraviolet ray at the optimum focusing depth with the NSR1505i6A reduction projection stepper (of Nikon Corporation, NA=0.45, λ=365 nm).

The coating film was then baked on a hot plate at 200° C. for 1 hour to form a substrate (1) for evaluation. The cured film obtained from the composition of the present invention formed on the substrate (1) had a thickness of 2.7 μm.

Evaluation of Transparency

The transmission of the substrate (1) for evaluation was measured with the Model 150-20 Double Beam, a spectrophotometer (of Hitachi, Ltd.), at a wavelength of 400 to 800 nm. The minimum transmission is shown in Table 1. When this value is larger than 95%, transmission is excellent, when the value is 90 to 95%, the transmission is satisfactory, and when the value is smaller than 90 %, the transmission is unsatisfactory.

Evaluation of Contact Angle 10 mg of water was dropped on the substrate (1) for evaluation to measure its contact angle with a contact angle meter (CA-X of Kyowa Interface Science Co., Ltd.). The results are shown in Table 1. When this angle is 80° or more, the contact angle is satisfactory.

20 mg of methylene iodide was dropped in place of water to measure its contact angle in the same manner as above. The results are shown in Table 1. When this angle is 50° or more, the contact angle is satisfactory.

Further, 7 mg of n-hexadecane was dropped in place of water to measure its contact angle in the same manner as above. The results are shown in Table 1. When this angle is 20° or more, the contact angle is satisfactory.

Evaluation of Fall Angle

The substrate (1) for evaluation was placed horizontally, 10 mg of water was dropped on the substrate, and the substrate was inclined to measure an angle at which the drop on the substrate began to move. The results are shown in Table 1. When this angle is 70° or less, the fall angle is satisfactory.

5 mg of toluene was dropped in place of water to measure its fall angle in the same manner as above. The results are shown in Table 1. When this angle is 20° or less, the fall angle is satisfactory.

Evaluation of Heat-Resistant Dimensional Stability

After the substrate (1) for evaluation was heated in an oven at 200° C. for 1 hour, the thickness of the film was measured before and after heating. When the thickness after heating is larger than 95% and 100% or less of the thickness before heating, the heat-resistant dimensional stability of the film is excellent, when the thickness is 90 to 95%, the heat-resistant dimensional stability is satisfactory, and when the thickness is smaller than 90%, the heat-resistant dimensional stability is unsatisfactory. The results are shown in Table 1.

Evaluation of Chemical Resistance

A substrate having a cured film formed in the same manner as the substrate (1) for evaluation was immersed in a mixed solution of monoethanolamine and N-methylpyrrolidone (weight ratio of 70:30) at 30° C. for 15 minutes and the thickness of the cured film was measured before and after immersion. When the thickness of the film after immersion is 99 to 103% of the thickness of the film before immersion, the chemical resistance of the film is satisfactory. However, when the cured film swells big or peels off from the substrate, the chemical resistance is unsatisfactory. The results are shown in Table 1.

Formation of a Rib

The above prepared composition solution was applied to a glass substrate by a spinner and prebaked on a hot plate at 110° C. for 2 minuets to form a 3.0 μm-thick coating film.

The obtained coating film was exposed to ultraviolet radiation at the optimum focusing depth with the NSR1505i6A reduction projection exposure device (of Nikon Corporation, NA=0.45, λ=365 nm) through a predetermined pattern mask and then PEB'ed on a hot plate at 110° C. for 2minutes. The film was then developed with a 0.5 wt % aqueous solution of tetramethylammonium hydroxide at 25° C. for 1 minute, washed in water and dried.

Thereafter, it was post-baked on a hot plate at 200° C. for 1 hour to form a matrix-form rib on the glass substrate.

Evaluation of Surface Uniformity Among Pixels

A solution for forming a polymer organic EL emitting layer (a 2.9 wt % xylene solution of poly-p-phenylenevinylene) was dropped on the glass substrate having the above formed matrix-form rib and heated in an oven at 220° C. for 30 minutes to form pixels. The thickness of the film was measured at 5 different points in each of the formed pixels. Variations in the thickness of the film are shown in Table 1. When the value is smaller than 2%, surface uniformity in a pixel is extremely excellent, when the value is 2% or more and less than 3%, surface uniformity in a pixel is excellent, when the value is 3% or more and less than 5%, surface uniformity in a pixel is satisfactory, and when the value is larger than 5%, surface uniformity in a pixel is unsatisfactory.

Example 2

The radiation sensitive resin composition of the present invention was prepared and the formation and evaluation of a rib were carried out in the same manner as in Example 1 except that the resin (2) was used as the component (A). The results are shown in Table 1.

Example 3

The radiation sensitive resin composition of the present invention was prepared and the formation and evaluation of a rib were carried out in the same manner as in Example 1 except that the resin (3) was used as the component (A) and 3 parts by weight of AY43-158E (silicon-containing fluorine-based surface modifier of Toray Dow Corning Silicone Co., Ltd.) was dissolved as the component (D). The results are shown in Table 1.

Example 4

The radiation sensitive resin composition of the present invention was prepared and the formation and evaluation of a rib were carried out in the same manner as in Example 1 except that the resin (4) was used as the component (A) and 3 parts by weight of a perfluoroalkyl group-containing oligomer (Megafac F172 of Dainippon Ink and Chemicals, Inc.) was dissolved as the component (D). The results are shown in Table 1.

Example 5

The radiation sensitive resin composition of the present invention was prepared and the formation and evaluation of a rib were carried out in the same manner as in Example 1 except that the resin (5) was used as the component (A) and 3 parts by weight of FS1265 (silicon-containing fluorine-based surface modifier of Toray Dow Corning Silicone Co., Ltd.) was dissolved as the component (D). The results are shown in Table 1.

TABLE 1

| | Radiation sensitivity | transparency (%) | contact angle (°) | | | fall angle (°) | | heat-resistant dimensional stability (%) | chemical resistance (%) | surface uniformity in a pixel (%) |
|---|---|---|---|---|---|---|---|---|---|---|
| | | | water | methylene iodide | n-hexadecane | water | toluene | | | |
| Ex. 1 | 145 | 91 | 101 | 62 | 32 | 64 | 9 | 99 | 101 | 1 |
| Ex. 2 | 150 | 92 | 110 | 75 | 55 | 50 | 7 | 98 | 100 | 2 |
| Ex. 3 | 150 | 90 | 105 | 70 | 45 | 62 | 9 | 98 | 99 | 2 |
| Ex. 4 | 155 | 92 | 106 | 78 | 50 | 53 | 6 | 98 | 102 | 2 |
| Ex. 5 | 145 | 90 | 105 | 68 | 43 | 62 | 8 | 99 | 101 | 1 |

Ex.: Example

According to the present invention, there are provided a radiation sensitive resin composition for forming a rib, which is suitable for use as a rib material when an organic EL layer is formed by coating in the production of an organic EL display element or when ITO transparent electrodes are formed in the production of a liquid crystal display element, a rib formed therefrom, a method of forming the rib, an organic EL display element having the rib and a liquid crystal display element having the rib.

The rib of the present invention does not cause a "satellite" phenomenon when an organic EL layer or ITO transparent electrodes are formed by coating, and the organic EL display element and liquid crystal display element of the present invention having the rib are excellent in productivity and reliability.

What is claimed is:

1. In an organic EL display element comprising an organic electroluminescent layer and a rib; the improvement comprising said rib comprises (A) a copolymer of (a-1) hexafluoropropylene, (a-2) an unsaturated carboxylic acid and/or unsaturated carboxylic anhydride and (a-3) an unsaturated compound other than the components (a-1) and (a-2); (B) an acid generating compound which generates an acid upon exposure to radiation; (C) a crosslinkable compound; and (D) a fluorine-containing organic compound other than the component (A).

2. An organic EL display element as claimed in claim 1, wherein the unsaturated carboxylic acid and/or unsaturated carboxylic anhydride (a-2) comprises is selected from the group consisting of crotonic acid, crotonic anhydride, maleic acid, maleic anhydride, itaconic acid, itaconic anhydride, and combinations thereof.

3. An organic EL display element as claimed in claim 1, wherein the unsaturated compound (a-3) is selected from the group consisting of an alkyl vinyl ether, a cycloalkyl vinyl ether, a carboxylic acid vinyl ester, a (fluoroalkyl) vinyl ether, a (fluoroalkoxyalkyl) vinyl ether, and combinations thereof.

4. An organic EL display element as claimed in claim 1, wherein the unsaturated compound (a-3) is selected from the group consisting of methyl vinyl ether, ethyl vinyl ether, n-propyl vinyl ether, isopropyl vinyl ether, tert-butyl vinyl ether, vinyl acetate, vinyl propionate, vinyl butyrate, vinyl pivalate, a perfluoroalkyl perfluorovinyl ether, and a perfluoroalkoxyalkyl perfluorovinyl ether, and combinations thereof.

5. An organic EL display element as claimed in claim 1, wherein the copolymer comprises 20 to 70 wt % amount of the monomer (a-1).

6. An organic EL display element as claimed in claim 1, wherein the copolymer comprises 1 to 40 wt % amount of the monomer (a-2).

7. An organic EL display element as claimed in claim 1, wherein the copolymer comprises 10 to 70 wt % of the unsaturated compound (a-3).

8. An organic EL display element as claimed in claim 1, wherein the rib has a water contact angle of 80° or more.

9. An organic EL display element as claimed in claim 1, wherein the rib has a water fall angle of 70° or less.

10. A method for making an organic EL display element as claimed in claim 1, which comprises:
    applying a composition comprising (A), (B), (C), and (D) to a substrate to form a coating film;
    exposing the coating film to radiation through a rib formation pattern mask; and
    developing the coating film with an alkaline developer to form the rib.

11. A method for making an organic EL display element as claimed in claim 10, which further comprises baking the coating film subsequent to said exposing.

12. In a liquid crystal device comprising an ITO electrode, a liquid crystal material, and a rib; the improvement comprising said rib comprises (A) a copolymer of (a-1) hexafluoropropylene, (a-2) an unsaturated carboxylic acid and/or unsaturated carboxylic anhydride and (a-3) an unsaturated compound other than the components (a-1) and (a-2); (B) an acid generating compound which generates an acid upon exposure to radiation; (C) a crosslinkable compound; and (D) a fluorine-containing organic compound other than the component (A).

13. A liquid crystal device as claimed in claim 12, wherein the unsaturated carboxylic acid and/or unsaturated carboxylic anhydride (a-2) is selected from the group consisting of crotonic acid, crotonic anhydride, maleic acid, maleic anhydride, itaconic acid, itaconic anhydride, and combinations thereof.

14. A liquid crystal device as claimed in claim 12, wherein the unsaturated compound (a-3) is selected from the group consisting of an alkyl vinyl ether, a cycloalkyl vinyl ether, a carboxylic acid vinyl ester, a (fluoroalkyl)vinyl ether, a (fluoroalkoxyalkyl) vinyl ether, and combinations thereof.

15. A liquid crystal device as claimed in claim 12, wherein the unsaturated compound (a-3) is selected from the group consisting of methyl vinyl ether, ethyl vinyl ether, n-propyl vinyl ether, isopropyl vinyl ether, tert-butyl vinyl ether, vinyl acetate, vinyl propionate, vinyl butyrate, vinyl pivalate, a perfluoroalkyl perfluorovinyl ether, and a perfluoroalkoxyalkyl perfluorovinyl ether, and combinations thereof.

16. A liquid crystal device as claimed in claim 12, wherein the copolymer comprises 20 to 70 wt % amount of the monomer (a-1).

17. A liquid crystal device as claimed in claim 12, wherein the copolymer comprises 1 to 40 wt % amount of the monomer (a-2).

18. A liquid crystal device as claimed in claim 12, wherein the copolymer comprises 10 to 70 wt % of the unsaturated compound (a-3).

19. A liquid crystal device as claimed in claim 12, wherein the rib has a water contact angle of 80° or more.

20. A liquid crystal device as claimed in claim 12, wherein the rib has a water fall angle of 70° or less.

21. A method for making a liquid crystal device as claimed in claim 12, which comprises:
    applying a composition comprising (A), (B), (C), and (D) to a substrate to form a coating film;
    exposing the coating film to radiation through a rib formation pattern mask; and
    developing the coating film with an alkaline developer to form the rib.

22. A method for making a liquid crystal device as claimed in claim 21, which further comprises baking the coating film subsequent to said exposing.

* * * * *